United States Patent
Akiho (10) Patent No.: US 6,944,303 B2
(45) Date of Patent: Sep. 13, 2005

(54) NOISE CANCELLATION DEVICE, ENGINE-NOISE CANCELLATION DEVICE, AND NOISE CANCELLATION METHOD

(75) Inventor: Masaichi Akiho, Iwaki (JP)

(73) Assignee: Alpine Electronics, Inc. (JP)

(*) Notice: Subject to any disclaimer, the term of this patent is extended or adjusted under 35 U.S.C. 154(b) by 186 days.

(21) Appl. No.: 10/364,665

(22) Filed: Feb. 11, 2003

(65) Prior Publication Data

US 2003/0219131 A1 Nov. 27, 2003

(30) Foreign Application Priority Data

Feb. 14, 2002 (JP) ........................ 2002-036829

(51) Int. Cl.[7] .................. A61F 11/06; G10K 11/16; H03B 29/00
(52) U.S. Cl. ................ 381/71.14; 381/71.8; 381/71.13
(58) Field of Search ............... 381/71.4, 71.1, 381/71.2, 71.8, 71.9, 71.11, 71.12, 71.13, 71.14, 71.5, 73.1, 94.1, 86; 181/224

(56) References Cited

U.S. PATENT DOCUMENTS

| | | | | |
|---|---|---|---|---|
| 4,475,232 A | * | 10/1984 | Shaw | 381/94.2 |
| 4,878,188 A | * | 10/1989 | Ziegler, Jr. | 708/300 |
| 5,010,576 A | * | 4/1991 | Hill | 381/71.9 |
| 5,359,662 A | * | 10/1994 | Yuan et al. | 381/71.14 |
| 5,633,795 A | * | 5/1997 | Popovich | 700/28 |
| 5,692,055 A | | 11/1997 | Sano et al. | 381/71.11 |
| 5,713,438 A | * | 2/1998 | Rossetti et al. | 188/378 |
| 5,758,311 A | | 5/1998 | Tsuji et al. | 381/71.11 |
| 5,912,821 A | * | 6/1999 | Kobayashi | 700/280 |
| 5,974,155 A | * | 10/1999 | Kashani et al. | 381/71.14 |
| 6,430,295 B1 | * | 8/2002 | Handel et al. | 381/94.7 |
| 6,654,467 B1 | * | 11/2003 | York et al. | 381/71.14 |
| 6,728,380 B1 | * | 4/2004 | Zhu et al. | 381/71.4 |

* cited by examiner

Primary Examiner—Xu Mei
(74) Attorney, Agent, or Firm—Brinks Hofer Gilson & Lione (57) ABSTRACT

A phase-locked loop (PLL) circuit generates a sine wave signal synchronized with an input signal. The sine wave signal is directly supplied to a first multiplier. The sine wave signal is also supplied to a second multiplier after shifting the phase by 90 degrees by an all-pass filter (APF). The first and second multipliers multiply the corresponding input signals by corresponding predetermined gains. An adder sums the products. Sound corresponding to the sum is produced from a speaker to a sound field. A filter-controlling unit controls the gains for the first and second multipliers, respectively, to minimize an error signal "e" for the output level of a microphone installed at a listening position.

12 Claims, 6 Drawing Sheets

NOISE CANCELLATION DEVICE, ENGINE-NOISE CANCELLATION DEVICE, AND NOISE CANCELLATION METHOD

BACKGROUND

1. Field of the Invention

The present invention relates to a noise cancellation device that cancels noise from an engine and the like.

2. Description of the Related Art

When automobiles are running, various kinds of noise such as road noise and wind noise invade the automobile cabin. Various measures to attenuate this noise have been taken in order to satisfy people's desire for luxury automobiles and to reduce driver fatigue. For example, a noise cancellation device has been known in which canceling sound supplied from a speaker installed underneath a seat or the like attenuates engine noise generated in the cabin when the engine is running.

Figure 5:
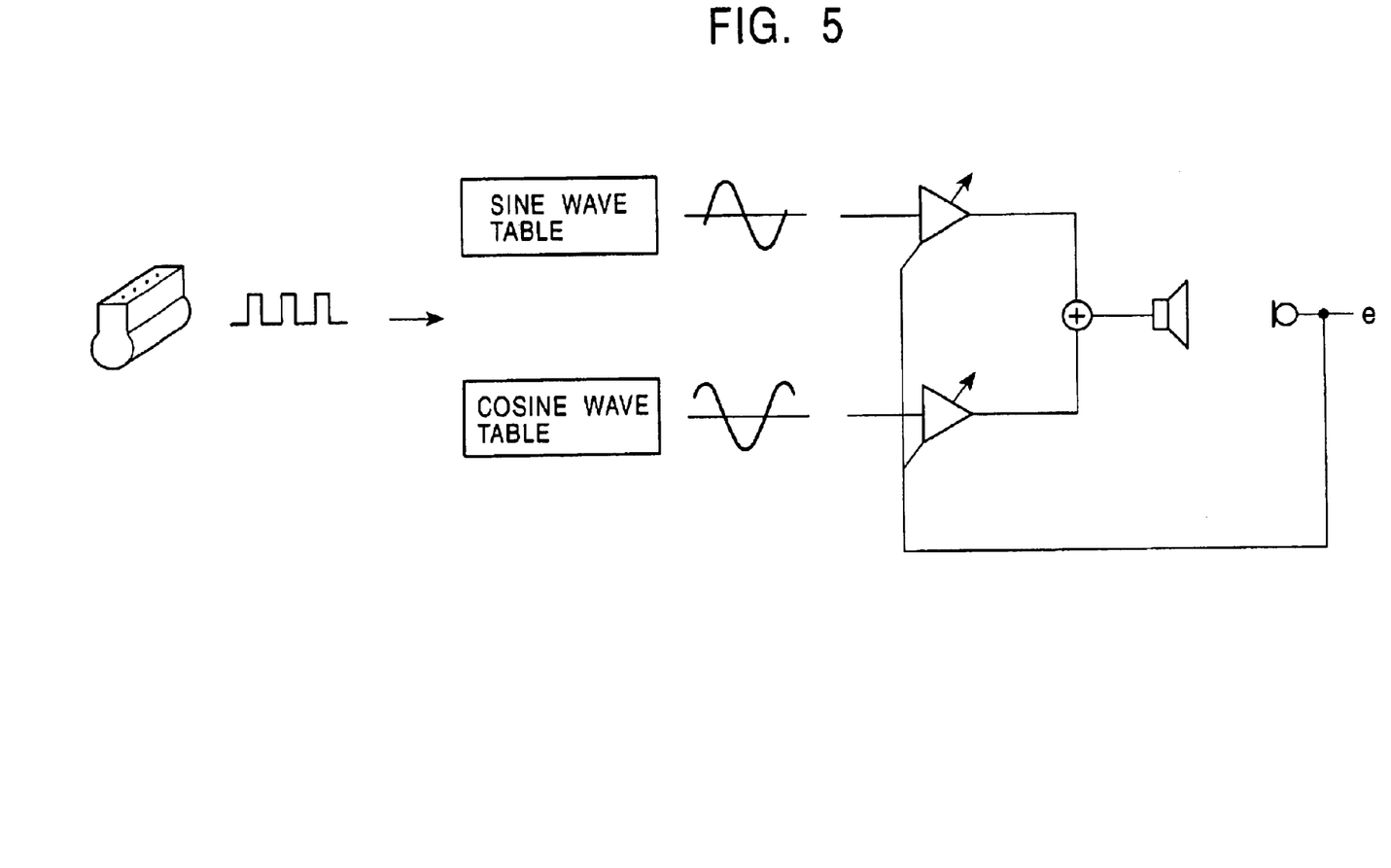
FIG. 5 is an illustration schematically showing a conventional noise cancellation device that attenuates engine noise invading an automobile cabin.
Figure 6:
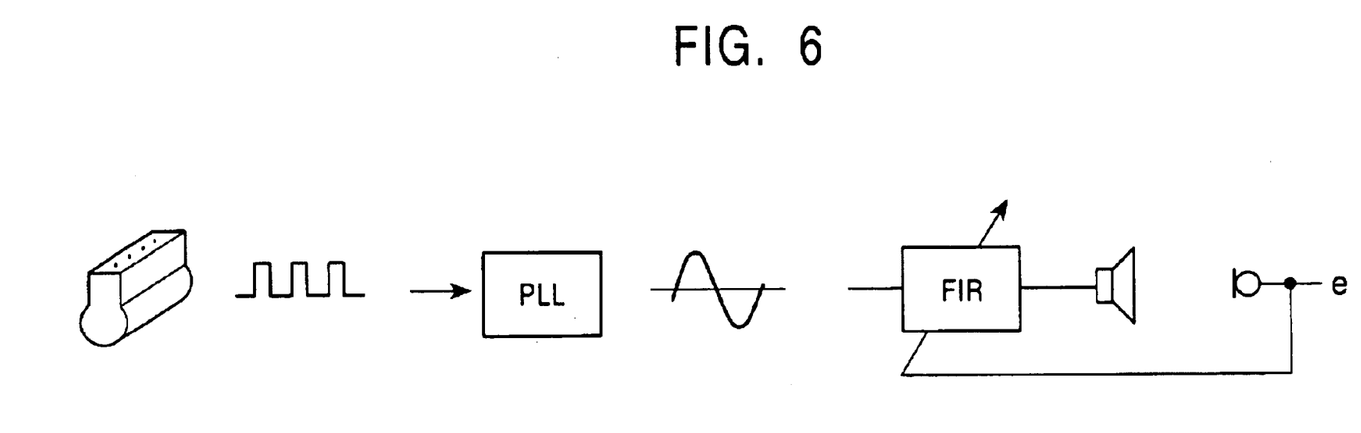
FIG. 6 is an illustration schematically showing a conventional noise cancellation device that attenuates engine noise invading the automobile cabin.

FIGS. 5 and 6 are schematic illustrations of structures of known noise cancellation devices that attenuate engine noise invading an automobile cabin.

In the noise cancellation device shown in FIG. 5, a sine wave signal and a cosine wave signal which are synchronized with the engine rotation are generated using a sine wave table and a cosine wave table, respectively. The noise cancellation device adjusts the gains of the sine wave signal and the cosine wave signal and then produces sound corresponding to the combined signal of the sine wave signal and the cosine wave signal from a speaker. The noise cancellation device adjusts the gains to minimize an error signal "e" at a particular listening position.

In the noise cancellation device shown in FIG. 6, the sine wave signal synchronized with the engine rotation is generated by using a phase-locked loop (PLL) circuit. The noise cancellation device filters the sine wave signal with a finite impulse response (FIR) filter and then produces sound corresponding to the filtered signal from a speaker. The noise cancellation device controls the filter coefficients of the FIR filter to minimize the error signal "e" at a particular listening position.

In the known noise cancellation device shown in FIG. 5, for example, when a signal synchronized with the engine rotation is provided as an input, a sine wave signal and a cosine wave signal are generated on the basis of the rising, the zero crossing point, and the like of the input signal by reading data stored in the sine wave table and the cosine wave table. The data from the sine wave table and the cosine wave table are read in response to the engine rotation. Because the engine rotation speed is variable, the amount of calculation increases, which complicates the processing. Moreover, the device will be expensive because a high-performance processor or the like is needed for performing the complicated processing.

In the known noise cancellation device shown in FIG. 6, in order to achieve good sound-deadening characteristics, the number of taps in the FIR filter must be increased. Thus, the size of the device becomes larger and the device becomes expensive. Also, because the filter coefficients of the FIR filter must be controlled in real time, the amount of calculation increases, which complicates the processing.

BRIEF SUMMARY

In view of the above-mentioned points, it is an object of the present invention to provide a noise cancellation device that is inexpensive and that can simplify processing.

In order to achieve the above-mentioned object, the present invention provides a noise cancellation device that generates canceling sound for canceling noise having a particular frequency. The noise cancellation device includes a first signal-generating unit that generates a sine wave signal having the same frequency as the noise; a second signal-generating unit that generates a cosine wave signal whose phase is shifted by 90 degrees with respect to the sine wave signal; a first gain-adjusting unit that adjusts the gain of the sine wave signal; a second gain-adjusting unit that adjusts the gain of the cosine wave signal; a combining unit that combines the two signals whose gains were adjusted by the first gain-adjusting unit and the second gain-adjusting unit, respectively; a speaker that produces sound corresponding to the signal combined by the combining unit in a predetermined space; a microphone installed in a listening position in the predetermined space; and a gain-controlling unit that controls the gains for the first gain-adjusting unit and the second gain-adjusting unit, respectively, to minimize the output level of the microphone. In order to generate the canceling sound by combining the sine wave signal and the cosine wave signal having the same frequency as the noise, the cosine wave signal is generated by shifting the phase of the sine wave signal by 90 degrees. Complicated processing can thus be eliminated, as compared with the case in which the sine wave signal and the cosine wave signal are generated by individually reading data in corresponding tables. Furthermore, adjusting both gains of the sine wave signal and the cosine wave signal generates the canceling sound, so there is no need to use a high-performance processor nor to increase the number of taps in an FIR filter in order to achieve good sound-deadening characteristics. Therefore, the cost of the device can be reduced.

It is preferable that the second signal-generating unit be an all-pass filter. It is also preferable that the phase shift between an input signal and an output signal be set to 90 degrees when a cut-off frequency of the all-pass filter coincides with the particular frequency. The cosine wave signal whose phase is shifted by 90 degrees with respect to the sine wave signal can thus be readily generated by a relatively simple structure.

Preferably, the noise cancellation device further includes a filter-controlling unit that controls the cut-off frequency to coincide with the particular frequency which varies with time. Controlling the cut-off frequency of the all-pass filter to coincide with the particular frequency allows the cosine wave signal whose phase is shifted by 90 degrees with respect to the sine wave signal to be continuously generated.

It is preferable that the first signal-generating unit be a phase-locked loop (PLL) circuit. The PLL circuit can readily generate the sine wave signal synchronized with the noise.

Preferably, the noise cancellation device further includes a frequency-determining unit that determines the particular frequency. It is preferable that the filter-controlling unit set the cut-off frequency on the basis of the particular frequency determined by the frequency-determining unit. The particular frequency of the noise can be readily determined by the frequency-determining unit, thus allowing the cut-off frequency of the all-pass filter to be controlled to coincide with the particular frequency.

DETAILED DESCRIPTION OF THE DRAWINGS AND THE PRESENTLY PREFERRED EMBODIMENTS

An engine-noise cancellation device according to an embodiment of the present invention will now be described with reference to the drawings.

Figure 1:
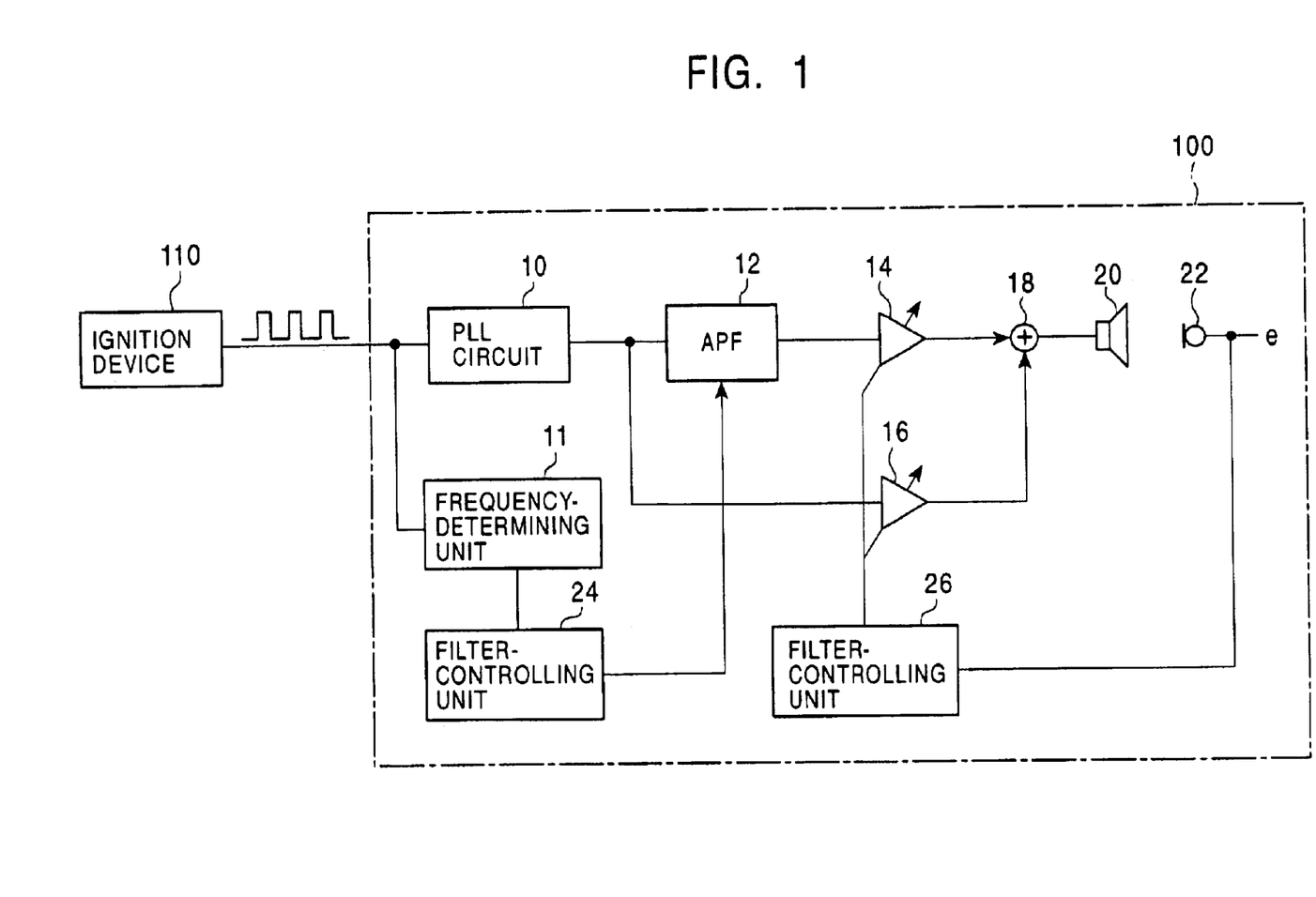
FIG. 1 is a block diagram schematically showing an engine-noise cancellation device according to an embodiment of the present invention.

FIG. 1 is a block diagram schematically showing an engine-noise cancellation device according to an embodiment of the present invention. An engine-noise cancellation device 100 generates a canceling sound that cancels noise invading an automobile cabin when an engine (not shown) is running. The engine-noise cancellation device 100 includes a phase-locked loop (PLL) circuit 10, a frequency-determining unit 11, an all-pass filter (APF) 12, multipliers 14 and 16, an adder 18, a speaker 20, a microphone 22, and filter-controlling units 24 and 26.

The engine-noise cancellation device 100, other than the speaker 20 and the microphone 22, functions as a digital signal processor (DSP) that performs digital processing. A digital/analog (D/A) converter provided upstream of the speaker 20 and an analog/digital (A/D) converter provided downstream of the microphone 22 are not shown in FIG. 1.

An ignition device 110 provides a signal synchronized with the engine rotation to the PLL circuit 10. The PLL circuit 10 generates a sine wave signal synchronized with the signal received from the ignition device 110. Although the signal synchronized with the engine rotation is received from the ignition device 110 in this embodiment, the signal synchronized with the engine rotation may be received from a rotation sensor or the like which is installed on the engine.

The frequency-determining unit 11 determines the frequency of the signal received from the ignition device 110. The frequency-determining unit 11 includes, for example, a frequency counter, and produces a count rate that corresponds to the frequency of the signal received from the ignition device 110.

The APF 12 is set so that a cut-off frequency coincides with the frequency of the sine wave signal generated by the PLL circuit 10. The APF 12 generates a cosine wave signal by shifting the phase of the input sine wave signal by 90 degrees. An exemplary structure of the APF 12 will be described below.

The multiplier 14 adjusts the gain of the cosine wave signal received from the APF 12 by multiplying the cosine wave signal by a predetermined gain. The multiplier 16 adjusts the gain of the sine wave signal received from the PLL circuit 10 by multiplying the sine wave signal by a predetermined gain. After the gains of the sine wave signal and the cosine wave signal are adjusted, the adder 18 combines the output signals from the multipliers 14 and 16. In general, combining the sine wave signal and the cosine wave signal whose gains are adjusted generates a sinusoidal signal whose frequency coincides with the sine wave signal and whose amplitude and phase are set to certain values.

The speaker 20 is, for example, installed underneath the driver's seat and produces sound corresponding to the sinusoidal output signal from the adder 18 in the cabin space. The microphone 22 is installed at a listening position in the cabin space and converts the collected sound into an electrical signal that is produced as an error signal "e".

The filter-controlling unit 24 controls the cut-off frequency of the APF 12 to coincide with the frequency of the sine wave signal generated by the PLL circuit 10. More specifically, the filter-controlling unit 24 controls the cut-off frequency of the APF 12 by setting filter coefficients in the APF 12 on the basis of the count rate received from the frequency-determining unit 11. The values of the filter coefficients are updated at predetermined time intervals (for example, every second).

The filter-controlling unit 26 controls the gains of the multipliers 14 and 16 to minimize the error signal "e" produced from the microphone 22. The filter-controlling unit 26 controls the gains, for example, by a least mean square (LMS) algorithm.

Figure 2:
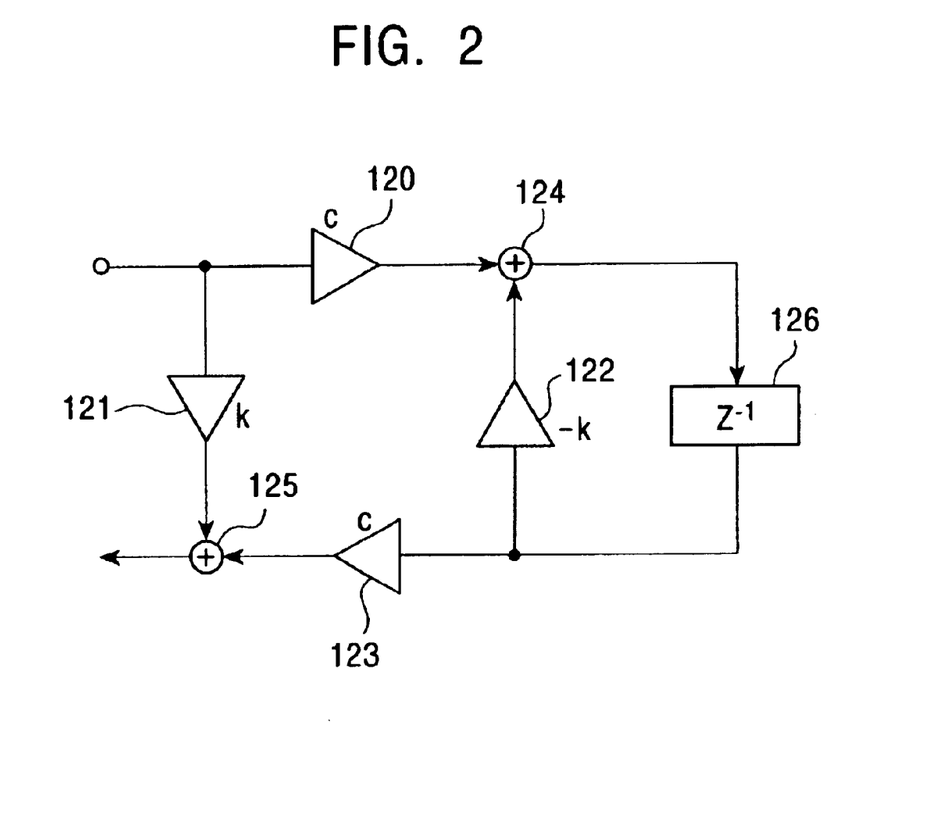
FIG. 2 is an illustration showing the detailed structure of an all-pass filter (APF) in FIG. 1.

FIG. 2 is an illustration showing the detailed structure of the APF 12. The APF 12 has a first-order structure and includes four multipliers 120, 121, 122, and 123, adders 124 and 125, and a delay unit 126. The multipliers 120, 121, 122, and 123 have multiplier factors (filter coefficients), "c", "k", "−k", and "c", respectively. These multiplier factors correspond to gains that amplify input data, for the multipliers 120, 121, 122, and 123, respectively. The delay unit 126 produces the input data after every sampling time. The adders 124 and 125 each add two input data signals and provides the sum as an output.

The data supplied to the APF 12 is multiplied by the multiplier factor "c" in the multiplier 120 and is provided to the adder 124. Also, the data supplied to the APF 12 is multiplied by the multiplier factor "k" in the multiplier 121 and is provided to the adder 125. The data from the adder 124 is supplied to the delay unit 126. The delayed data from the delay unit 126 is multiplied by the multiplier factor "−k" in the multiplier 122 and is provided to the adder 124 again. Also, the delayed data from the delay unit 126 is multiplied by the multiplier factor "c" in the multiplier 123 and is provided to the adder 125. The adder 124 adds the data received from the multipliers 120 and 122. The adder 125 adds the data from the multipliers 121 and 123 and provides the sum through the APF 12.

Accordingly, the APF 12 of the first-order structure can shift the phase of the input data by 90 degrees with respect to the cut-off frequency.

In order to realize the APF 12 of the first-order structure, the multiplier factors "k" and "c" used by the multipliers 120, 121, 122, and 123 must be set to the following values:

$$k = (\tan(\pi \cdot f_0/f_s) - 1)/(\tan(\pi \cdot f_0/f_s) + 1) \quad (1)$$

$$c = \sqrt{(1-k^2)} \quad (2),$$

where "$f_0$" represents the cut-off frequency and "$f_s$" represents the sampling frequency.

The multiplier factors "k" and "c" are set at predetermined time intervals in the filter-controlling unit 24.

In equations (1) and (2), a fixed value set beforehand is used for the sampling frequency "$f_s$", and the frequency of the signal synchronized with the engine rotation, supplied from the ignition device 110, is set as the cut-off frequency "$f_0$". As described above, the cut-off frequency "$f_0$" is set in the filter-controlling unit 24, for example, at one-second intervals, on the basis of the count rate received from the frequency-determining unit 11.

The PLL circuit 10, the frequency-determining unit 11, and the APF 12 correspond to first signal-generating means, frequency-determining means, and second signal-generating means, respectively. The multipliers 16 and 14 correspond to first and second gain-adjusting means, respectively. The adder 18 and the filter-controlling units 24 and 26 correspond to combining means, filter-controlling means, and gain-controlling means, respectively.

The operation of the engine-noise cancellation device 100 having the above-described structure will now be described.

The signal, which is synchronized with the engine rotation, is supplied from the ignition device 110 to the engine-noise cancellation device 100. Then, the PLL circuit 10 generates a sine wave signal synchronized with this input signal. The sine wave signal generated by the PLL circuit 10 is directly supplied to the multiplier 16 and is also supplied to the multiplier 14 through the APF 12.

The APF 12 is set so that the cut-off frequency coincides with the frequency of the sine wave signal received from the PLL circuit 10. The APF 12 shifts the phase of the input sine wave signal by 90 degrees and provides it as an output. Therefore, the sine wave signal is supplied to the multiplier 16, and the signal (cosine wave signal) whose phase is shifted by 90 degrees with respect to the sine wave signal is supplied to the multiplier 14 at the same time. The multipliers 14 and 16 multiply the corresponding input signals by corresponding predetermined gains. The products are supplied to the adder 18 and are summed together. Then a sinusoidal signal corresponding to this sum is supplied to the speaker 20 to generate a predetermined sound field.

The output sound from the speaker 20 is collected by the microphone 22, which is installed at the listening position. The filter-controlling unit 26 controls the gains for the multipliers 14 and 16 to minimize the error signal "e" for the output level of the microphone 22.

Accordingly, the engine-noise cancellation device 100 according to the embodiment generates two sinusoidal signals (the sine wave signal and the cosine wave signal) which differ in phase by 90 degrees, adjusts the respective gains of the sinusoidal signals, and adds the sinusoidal signals together, thereby generating a signal required for canceling the engine noise. The APF 12 in the engine-noise cancellation device 100 provides as an output the sine wave signal as the cosine wave signal, which differs in phase by 90 degrees from the sine wave signal. Consequently, unlike the case in which a sinusoidal signal is generated by using a sine wave signal table or the like, complicated processing such as reading the content of the table in synchronization with the input signal can be eliminated. Moreover, there is no need to increase the memory size by increasing the number of tap coefficients for the FIR filter nor to use a high-performance processor in order to improve the accuracy. Therefore, the cost of the device can be reduced.

Particularly, although the cut-off frequency of the APF 12 must coincide with a signal synchronized with the engine rotation, which is supplied from the ignition device 110, the cut-off frequency can be readily controlled by the filter-controlling unit 24 on the basis of the count rate received from the frequency-determining unit 11. Adequate setting of the cut-off frequency can be performed at predetermined time intervals, thus enabling a reduction in the amount of calculation. When the engine rotation speed varies, if the setting interval of the cut-off frequency increases, the difference between the frequency corresponding to the engine rotation speed and the frequency of the sine wave signal generated by the PLL circuit 10 temporarily increases. Even if this difference increases, the phase shift between the two sinusoidal signals varies from 90 degrees and it takes slightly longer for the error signal "e" from the microphone 22 to converge to the minimum. Therefore, the cut-off frequency is set, for example, at approximately one-second intervals, which enables the amount of calculation to be reduced.

Figure 3:
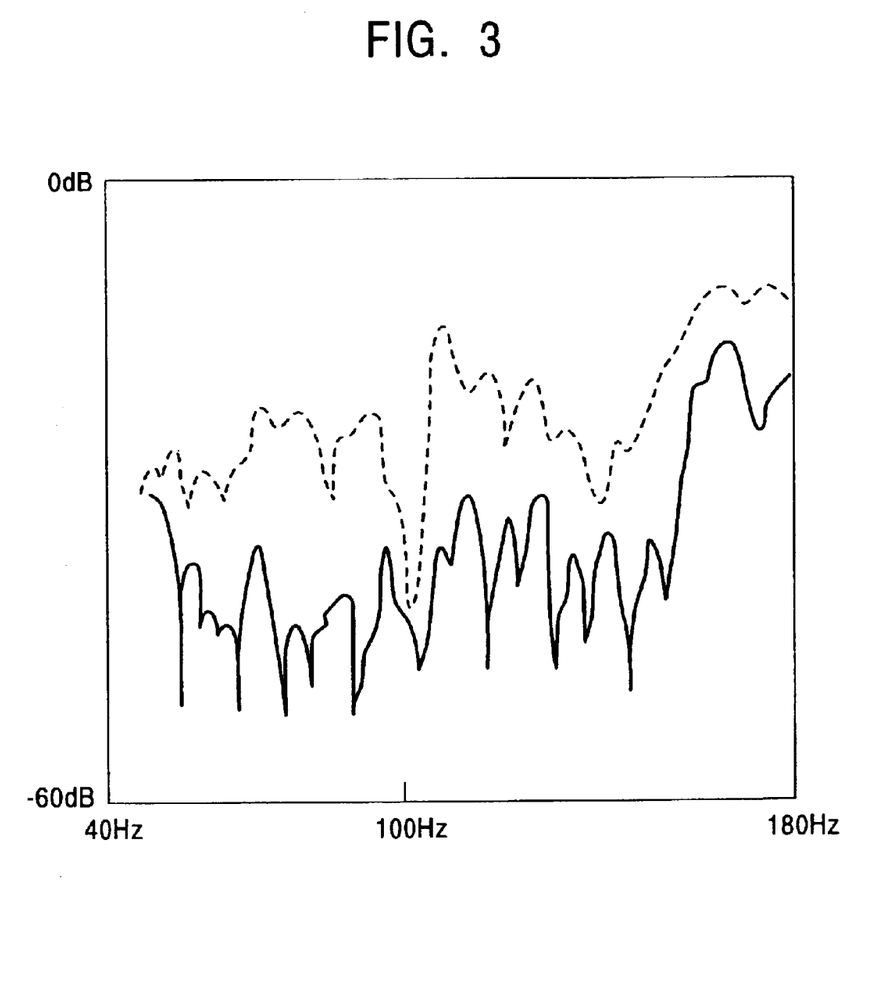
FIG. 3 is a graph showing the noise reduction effects of the engine-noise cancellation device according to the embodiment of the present invention.

FIG. 3 is a graph showing the noise reduction effects of the engine-noise cancellation device 100 according to the embodiment of the present invention. Referring to FIG. 3, the dotted line indicates the engine noise level when the engine-noise cancellation device 100 is not operated, and the solid line indicates the engine noise level when the engine-noise cancellation device 100 is operated. FIG. 3 shows that the use of the engine-noise cancellation device 100 according to the embodiment allows the noise level to be significantly reduced over the entire frequency range of the engine noise.

Figure 4:
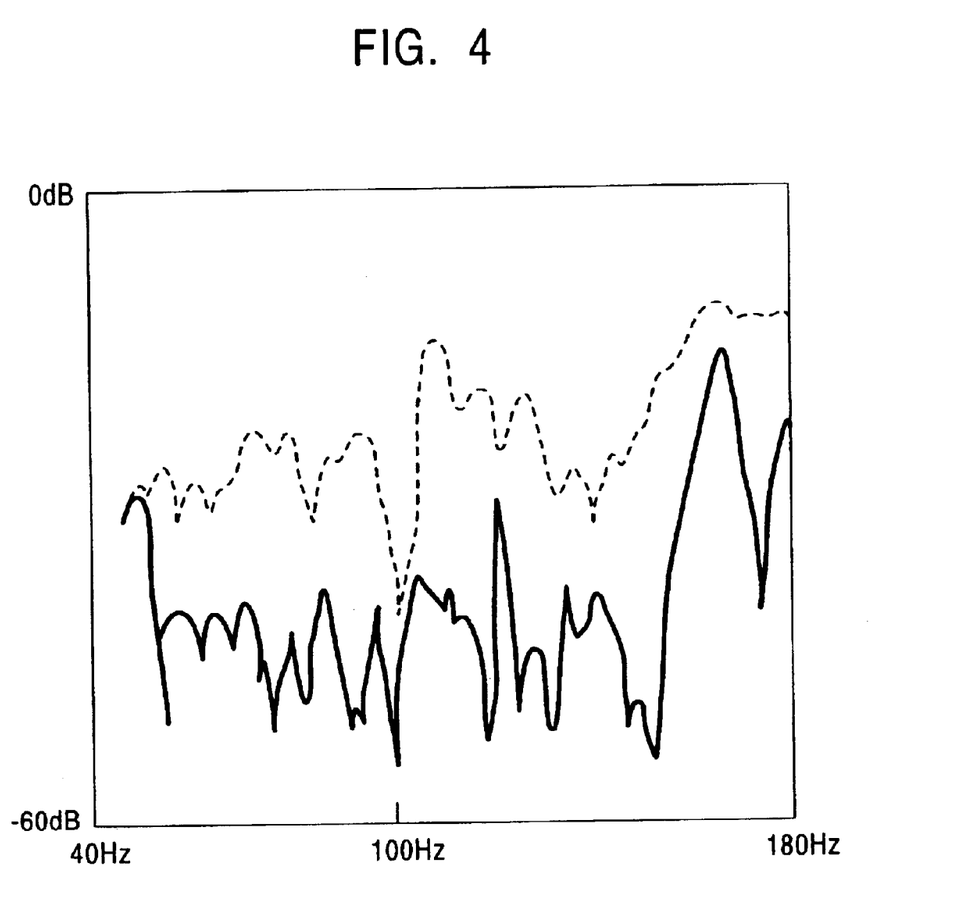
FIG. 4 is a graph showing the noise reduction effects of an engine-noise cancellation device having a conventional structure.

FIG. 4 is a graph showing the noise reduction effects of an engine-noise cancellation device having a conventional structure. Referring to FIG. 4, the dotted line indicates the engine noise level when the engine-noise cancellation device having the conventional structure is not operated, and the solid line indicates the engine noise level when the engine-noise cancellation device having the conventional structure is operated. FIGS. 3 and 4 show that the engine-noise cancellation device 100 according to the embodiment has sound-deadening characteristics equivalent to those of the engine-noise cancellation device having the conventional structure.

The present invention is not limited to the embodiment described above, and various modifications can be made therein without departing from the spirit and scope of the present invention. For example, although the case has been explained in which engine noise invading an automobile cabin is cancelled, the present invention is also applicable to a case in which a single frequency noise other than the engine noise is cancelled. For noise having different frequency components, sound for canceling respective frequency components can be separately generated by using the noise cancellation device according to the present invention.

What is claimed is:

1. A noise cancellation device that generates a canceling sound for canceling noise having a particular frequency, comprising:

a first signal-generating unit that generates a sine wave signal having substantially the same frequency as the noise;

a second signal-generating unit that generates a cosine wave signal whose phase is shifted by 90 degrees with respect to the sine wave signal, the second signal-generating unit comprising an all-pass filter;

a first gain-adjusting unit that adjusts the gain of the sine wave signal;

a second gain-adjusting unit that adjusts the gain of the cosine wave signal;

a combining unit that combines the output signals of the first gain-adjusting unit and the second gain-adjusting unit;

a speaker that produces sound corresponding to the output of the combining unit in a predetermined space;

a microphone installed at a listening position in the predetermined space; and a gain-controlling unit that controls the gains of the first gain-adjusting unit and the second gain-adjusting unit, respectively, to minimize the output level of the microphone;

wherein the all-pass filter shifts a signal inputted into the all-pass filter by 90 degrees with respect to a cut-off frequency of the all-pass filter set to coincide with the particular frequency.

2. A noise cancellation device according to claim 1, further comprising a filter-controlling unit that controls the cut-off frequency to coincide with the particular frequency which varies with time.

3. A noise cancellation device according to claim 1, wherein the first signal-generating unit comprises a phase-locked loop circuit.

4. A noise cancellation device according to claim 2, further comprising a frequency-determining unit that determines the particular frequency, wherein the filter-controlling unit sets the cut-off frequency on the basis of the particular frequency determined by the frequency-determining unit.

5. An engine-noise cancellation device that generates a canceling sound for canceling engine noise having a particular frequency, comprising:

a first signal-generating unit that generates a sine wave signal having substantially the same frequency as the engine noise;

a second signal-generating unit that generates a cosine wave signal whose phase is shifted by 90 degrees with respect to the sine wave signal, the second signal-generating unit comprising an all-pass filter;

a first gain-adjusting unit that adjusts the gain of the sine wave signal;

a second gain-adjusting unit that adjusts the gain of the cosine wave signal;

a combining unit that combines the output signals of the first gain-adjusting unit and the second gain-adjusting unit;

a speaker that produces sound corresponding to the output of the combining unit in a cabin space;

a microphone installed at a listening position in the cabin space; and a gain-controlling unit that controls the gains of the first gain-adjusting unit and the second gain-adjusting unit, respectively, to minimize the output level of the microphone;

wherein the all-pass filter shifts a signal inputted into the all-pass filter by 90 degrees with respect to a cut-off frequency of the all-pass filter set to coincide with the particular frequency.

6. An engine-noise cancellation device according to claim 5, further comprising a filter-controlling unit that controls the cut-off frequency to coincide with the particular frequency which varies with time.

7. An engine-noise cancellation device according to claim 5, wherein the first signal-generating unit comprises a phase-locked loop circuit.

8. An engine-noise cancellation device according to claim 6, further comprising a frequency-determining unit that determines the particular frequency, wherein the filter-controlling unit sets the cut-off frequency on the basis of the particular frequency determined by the frequency-determining unit.

9. A noise cancellation method that generates a canceling sound for canceling noise having a particular frequency, comprising the steps of:

generating a sine wave signal having substantially the same frequency as the noise;

generating a cosine wave signal whose phase is shifted by 90 degrees with respect to the sine wave signal;

adjusting the gain of the sine wave signal;

adjusting the gain of the cosine wave signal;

combining the two signals whose gains were adjusted;

producing sound corresponding to the combined signal in a predetermined space;

collecting the output sound at a listening position in the predetermined space; and controlling the respective gains of the sine wave signal and the cosine wave signal to minimize the output level of the collected sound;

wherein the cosine wage signal is generated by an all-pass filter that shifts a signal inputted into the all-pass filter by 90 degrees with respect to a cut-off frequency of the all-pass filter set to coincide with the particular frequency.

10. A noise cancellation method according to claim 9, wherein the cut-off frequency is controlled to coincide with the particular frequency which varies with time.

11. A noise cancellation method according to claim 9, wherein the sine wave signal is generated by a phase-locked loop circuit.

12. A noise cancellation method according to claim 10, wherein the particular frequency is determined, and wherein the cut-off frequency is set on the basis of the determined particular frequency.

* * * * *